(12) United States Patent
Seyama (10) Patent No.: US 12,176,317 B2
(45) Date of Patent: Dec. 24, 2024

(54) SEMICONDUCTOR DEVICE MANUFACTURING DEVICE AND MANUFACTURING METHOD

(71) Applicant: SHINKAWA LTD., Tokyo (JP)

(72) Inventor: Kohei Seyama, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 448 days.

(21) Appl. No.: 17/611,172

(22) PCT Filed: Nov. 12, 2020

(86) PCT No.: PCT/JP2020/042204
§ 371 (c)(1),
(2) Date: Nov. 14, 2021

(87) PCT Pub. No.: WO2021/100591
PCT Pub. Date: May 27, 2021

(65) Prior Publication Data
US 2022/0254751 A1    Aug. 11, 2022

(30) Foreign Application Priority Data
Nov. 19, 2019   (JP) ................. 2019-209095

(51) Int. Cl.
*B23K 3/00* (2006.01)
*B23K 1/00* (2006.01)
*H01L 23/00* (2006.01)

(52) U.S. Cl.
CPC ............ *H01L 24/75* (2013.01); *B23K 1/0016* (2013.01); *B23K 3/00* (2013.01); *H01L 24/81* (2013.01);
(Continued)

(58) Field of Classification Search
CPC .. B23K 1/0016; B23K 3/00; B23K 3/04–053; H01L 24/75; H01L 24/81;
(Continued)

(56) References Cited

U.S. PATENT DOCUMENTS 7,075,036 B2 *   7/2006  Ogimoto .............. B23K 20/023
                                                   228/102
10,350,692 B2    7/2019  Seyama et al.
(Continued)

FOREIGN PATENT DOCUMENTS

CN        1235371 A  *  11/1999  ............. B23K 1/002
CN       105280527       1/2016
(Continued)

OTHER PUBLICATIONS

Machine translation of JP2007258483A (no date available).*
(Continued)

*Primary Examiner* — Kiley S Stoner
(74) *Attorney, Agent, or Firm* — JCIPRNET (57) ABSTRACT

A semiconductor device manufacturing device (10) comprises: a stage (16) on which a substrate (100) is loaded; a bonding head (14) that is disposed facing the stage (16) and that bonds a semiconductor chip (110) to the substrate (100); and a controller (18). The bonding head (14) includes: an attachment (33) that holds the semiconductor chip (110) by suctioning; and a heating part (31) that detachably holds the attachment (33) and that heats the attachment (33). The heating part (31) has a first heating area (32a) and a second heating area (32b) that surrounds the first heating area (32a) in the horizontal direction. The controller (18) controls the temperatures of the first heating area (32a) and the second heating area (32b) independently.

7 Claims, 5 Drawing Sheets

(52) U.S. Cl.
CPC ............... *H01L 2224/75282* (2013.01); *H01L 2224/75502* (2013.01); *H01L 2224/75745* (2013.01); *H01L 2224/7592* (2013.01); *H01L 2224/81238* (2013.01); *H01L 2224/81908* (2013.01)

(58) Field of Classification Search
CPC . H01L 2224/75282; H01L 2224/75502; H01L 2224/75745; H01L 2224/7592; H01L 2224/81238; H01L 2224/81908; H01L 24/13; H01L 24/16; H01L 24/29; H01L 24/32; H01L 24/73; H01L 2224/131; H01L 2224/13101; H01L 2224/2919; H01L 24/83; H01L 2224/73204; H01L 2224/75313; H01L 2224/759; H01L 2224/75901; H01L 2224/81399; H01L 2224/81815; H01L 2224/83855; H01L 2924/07802; H01L 21/50; H01L 2224/81191; H01L 2224/83191; H01L 2224/83399; H01L 2224/75253; H01L 2224/753; H01L 2224/81099; H01L 2224/81203; H01L 21/67144; H01L 21/52; H01L 21/67103; H01L 21/67721; H01L 21/6838; H05K 13/0409
USPC ... 228/102–103, 179.1–180.22, 233.2, 8–12, 228/6.2
See application file for complete search history.

(56) References Cited

U.S. PATENT DOCUMENTS

| | | | | |
|---|---|---|---|---|
| 2014/0202636 | A1* | 7/2014 | Mayr | B30B 15/34 156/378 |
| 2018/0068921 | A1* | 3/2018 | Wang | H01L 24/96 |
| 2021/0098415 | A1* | 4/2021 | Lee | B29C 66/8185 |
| 2021/0398936 | A1* | 12/2021 | Park | B23K 26/702 |

FOREIGN PATENT DOCUMENTS

| | | | | | |
|---|---|---|---|---|---|
| CN | 105280527 | A | * | 1/2016 | ............ H01L 21/67 |
| JP | H08124972 | | | 5/1996 | |
| JP | H11204591 | A | * | 7/1999 | |
| JP | 2000013005 | A | * | 1/2000 | ............ H01L 24/75 |
| JP | 2004029576 | | | 1/2004 | |
| JP | 2004063948 | A | * | 2/2004 | ............ H01L 24/75 |
| JP | 2005093838 | A | * | 4/2005 | ........... H01L 21/561 |
| JP | 2007258483 | | | 10/2007 | |
| JP | 2007258483 | A | * | 10/2007 | ............ H01L 24/75 |
| JP | 5437221 | B2 | * | 3/2014 | ............ H01L 24/75 |
| JP | 2015233138 | | | 12/2015 | |
| JP | 2016122726 | A | * | 7/2018 | |
| JP | 2019033188 | | | 2/2019 | |
| KR | 101741769 | B1 | * | 5/2017 | |
| TW | I489598 | | | 6/2015 | |
| WO | WO-2014186337 | A1 | * | 11/2014 | ......... B23K 37/0408 |
| WO | WO-2015045997 | A1 | * | 4/2015 | ........... B23K 20/026 |
| WO | WO-2019039508 | A1 | * | 2/2019 | ............ G01N 25/18 |

OTHER PUBLICATIONS

Machine translation of JPH0812972A (no date available).*
Office Action of Taiwan Counterpart Application, with partial English translation thereof, issued on Jun. 21, 2023, pp. 1-18.
"International Search Report (Form PCT/ISA/210) of PCT/JP2020/042204," mailed on Feb. 2, 2021, with English translation thereof, pp. 1-4.
"Office Action of Taiwan Counterpart Application" with English translation thereof, issued on Mar. 25, 2022, p. 1-p. 15.
Office Action of China Counterpart Application, with partial English translation thereof, issued on Sep. 27, 2023, pp. 1-9.
"Office Action of Taiwan Counterpart Application", issued on Dec. 29, 2022, with English translation thereof, pp. 1-9.

* cited by examiner

SEMICONDUCTOR DEVICE MANUFACTURING DEVICE AND MANUFACTURING METHOD

CROSS-REFERENCE TO RELATED APPLICATION

This application is a 371 application of the International PCT application serial no. PCT/JP2020/042204, filed on Nov. 12, 2020, which claims the priority benefits of Japan Patent Application No. 2019-209095, filed on Nov. 19, 2019. The entirety of each of the above-mentioned patent applications is hereby incorporated by reference herein and made a part of this specification.

TECHNICAL FIELD

The present specification discloses a semiconductor device manufacturing device and a semiconductor device manufacturing method in which a semiconductor device is manufactured with one or more semiconductor chips bonded on a substrate.

RELATED ART

In the related art, a semiconductor device manufacturing device for manufacturing a semiconductor device with one or more semiconductor chips bonded on a substrate is known. Such a manufacturing device is usually provided with a bonding tool that sucks and holds a semiconductor chip and bonds it to a substrate or another semiconductor chip. The bonding tool is provided with a heating part that is heated by the heating means and an attachment which is detachably attached to the heating part. The semiconductor chip is adsorbed and held via the attachment, and the attachment is appropriately replaced according to a size of the semiconductor chip to be handled or the like. When a semiconductor chip is bonded, the bonding tool heats the semiconductor chip to be bonded while pressurizing the semiconductor chip.

CITATION LIST

Patent Literature

[Patent Literature 1]
Japanese Patent Lain-Open No. 2004-29576

SUMMARY OF INVENTION

Technical Problem

Here, when a semiconductor chip is bonded, a temperature distribution of an object to be heated (for example, a semiconductor chip or the like) needs to be a desired distribution. For example, in a flip chip bonder, a plurality of bumps formed on a bottom surface of a semiconductor chip is thermally melted and bonded to an electrode formed on a substrate or a surface of another semiconductor chip. At this time, if the temperature distribution of the semiconductor chip is non-uniform, the molten state of the bumps varies depending on a location, which causes problems such as poor bonding and a non-uniform gap amount between the semiconductor chip and the substrate (or another semiconductor chip). Therefore, in the flip chip bonder, the temperature distribution of the semiconductor chip which is an object to be heated needs to be uniform. Further, depending on the type of bonding or object to be heated, there are cases in which a peripheral edge portion of the object to be heated is desired to have a higher temperature than a central portion, or the central portion of the object to be heated is desired to have a higher temperature than the peripheral edge portion.

However, although a heat absorption rate on a side of the object to be heated (for example, a semiconductor chip) varies depending on a location, the bonding tool of the related art has only one heating system. On the other hand, the heat absorption rate of the object to be heated is usually higher in the vicinity of a peripheral edge than in the central portion. Therefore, a temperature of the object to be heated when heated by the bonding tool tends to decrease as it approaches the peripheral edge. That is, with the technique of the related art, it is difficult to obtain the desired temperature distribution of the object to be heated.

In Patent Literature 1, the technique in which an anisotropic conductive film is disposed on a peripheral edge portion for connection of a display panel, and the anisotropic conductive film is pressed while being heated by a heater tool for temporary pressure bonding, and thus the anisotropic conductive film is attached to the peripheral edge portion is disclosed. In Patent Literature 1, to prevent temporary pressure bonding defects at both end portions of the anisotropic conductive film, the heater tool for temporary pressure bonding is divided into a main heater tool that presses an intermediate portion of the anisotropic conductive film and an end portion heater tool that presses both end portions of the anisotropic conductive film, and a temperature of the main heater tool and a temperature of the end portion heater tool are controlled such that both end portions of the anisotropic conductive film have a higher temperature than the intermediate portion. The technique of Patent Literature 1 is merely a technique relating to pressure bonding of an anisotropic conductive film and cannot be applied to bonding of a semiconductor chip.

Therefore, the present specification discloses a semiconductor device manufacturing device and a semiconductor device manufacturing method in which the temperature distribution of the object to be heated at the time of bonding can be controlled.

Solution to Problem

A semiconductor device manufacturing device disclosed in the present specification includes a stage on which a substrate is loaded; a bonding head that is disposed facing the stage and bonds a semiconductor chip to the substrate; and a controller, wherein the bonding head includes an attachment that holds the semiconductor chip by suctioning; and a heating part that detachably holds the attachment and heats the attachment, the heating part having a first heating area and a second heating area that surrounds the first heating area in a horizontal direction, and wherein the controller controls a temperature of the first heating area and a temperature of the second heating area independently.

In this case, the controller may control a heat generating amount of the first heating area and a heat generating amount of the second heating area such that an in-plane temperature distribution of the semiconductor chip becomes uniform during bonding execution.

Further, the bonding head may further have a temperature sensor that detects the temperature of the first heating area and a temperature sensor that detects the temperature of the second heating area, and the controller may store an area target temperature of the first heating area and an area target temperature of the second heating area in advance and may control the heat generating amount of the first heating area and the heat generating amount of the second heating area according to a difference between the stored area target temperature and an area detection temperature of the temperature sensor.

Further, the bonding head may further have cooling paths which are provided to correspond to the first heating area and the second heating area and are independent of each other, the cooling paths cooling the first heating area and the second heating area corresponding to flow of a refrigerant, and the controller may control the heat generating amount and a flow rate of the refrigerant according to the difference between the stored area target temperature and the area detection temperature of the temperature sensor.

Further, the controller may be configured to execute a target acquisition process for acquiring the area target temperature prior to bonding the semiconductor chip, and in the target acquisition process, the controller may cause the bonding head to bond a sample chip, may acquire a temperature distribution of the sample chip and the area detection temperature of the first heating area and the area detection temperature of the second heating area at that time, and may calculate the area target temperature of the first heating area and the area target temperature of the second heating area on the basis of the obtained chip temperature distribution and area detection temperatures.

Further, the area target temperature of the first heating area may be lower than the area target temperature of the second heating area.

Further, a semiconductor device manufacturing method disclosed in the present specification includes a step of loading a substrate on a stage; and a step of driving a bonding head capable of moving with respect to the stage and bonding a semiconductor chip to the substrate, wherein the bonding head has an attachment that holds the semiconductor chip by suctioning; and a heating part that detachably holds the attachment and heats the attachment, the heating part having a first heating area and a second heating area that surrounds the first heating area in a horizontal direction, and wherein a controller controls a temperature of the first heating area and a temperature of the second heating area independently during execution of the bonding.

Advantageous Effects of Invention

According to the semiconductor device manufacturing device and manufacturing method disclosed in the present specification, the heating part of the bonding head is divided into a first heating area and a second heating area, and the controller controls the temperature of the first heating area and the temperature of the second heating area independently, and thus the temperature distribution of the object to be heated at the time of bonding can be controlled.

DESCRIPTION OF EMBODIMENTS

Figure 1:
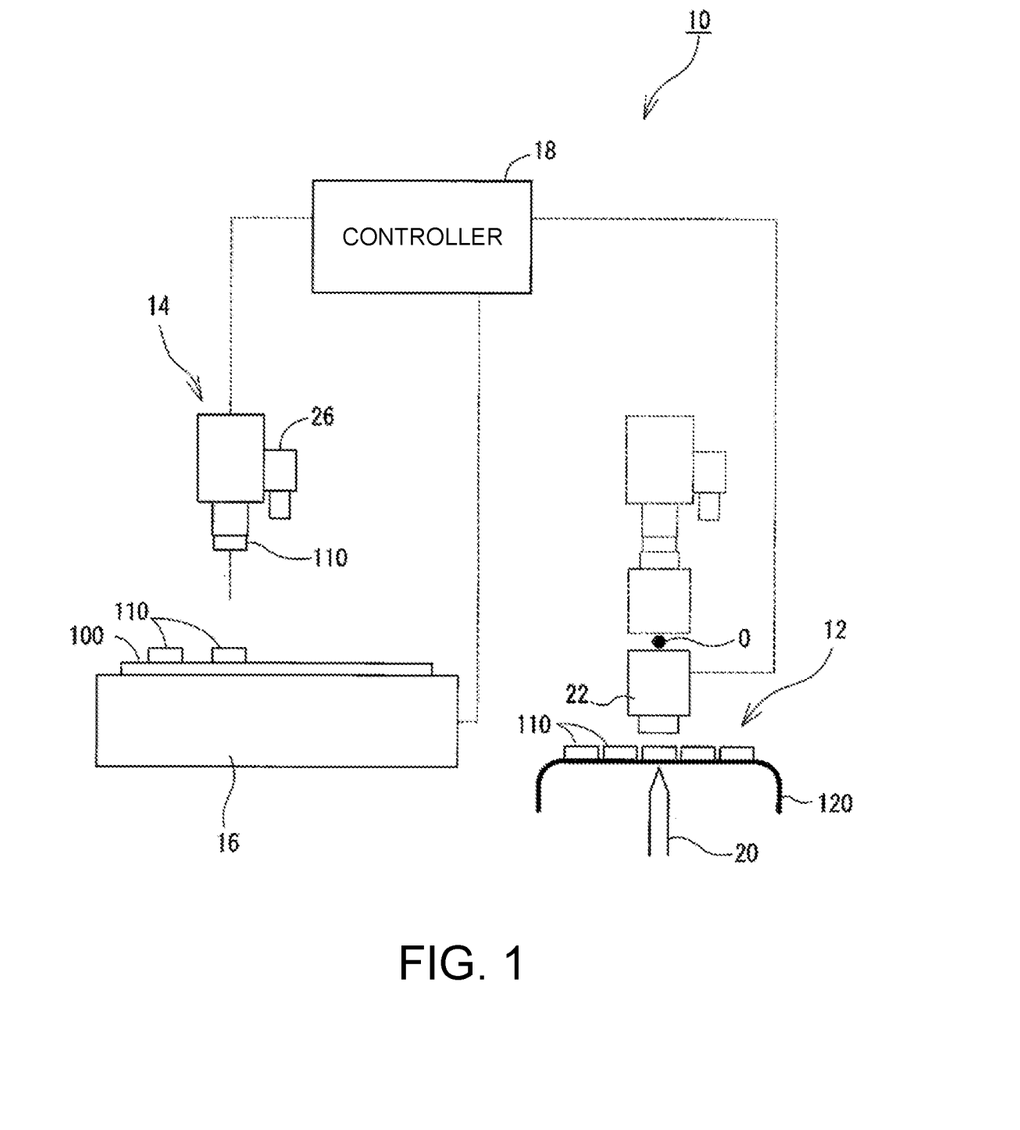
FIG. 1 is a schematic view showing a configuration of a manufacturing device.

Hereinafter, a configuration of a semiconductor device manufacturing device 10 will be described with reference to the drawings. FIG. 1 is a schematic view showing a configuration of the manufacturing device 10. The manufacturing device 10 manufactures a semiconductor device by bonding a plurality of semiconductor chips 110 to a substrate 100.

The manufacturing device 10 includes a pickup unit 12, a bonding head 14, a stage 16, and a controller 18. The pickup unit 12 has a push-up pin 20 that pushes up the semiconductor chip 110 loaded on a dicing tape 120, and a pickup head 22 that holds the pushed-up semiconductor chip 110 on its bottom surface. The pickup head 22 is rotatable about a rotation axis O extending in a horizontal direction. When the pickup head 22 rotates 180 degrees, the picked-up semiconductor chip 110 can be inverted 180 degrees in a thickness direction. As a result, the surface of the semiconductor chip 110 which is adhered to the dicing tape 120 faces upward.

The bonding head 14 is moved in the horizontal direction parallel to an upper surface of the stage 16 by an XY drive mechanism (not shown) and is moved in a vertical direction orthogonal to the horizontal direction by a Z-axis drive mechanism (not shown). The bonding head 14 is provided with an attachment (not shown in FIG. 1) that adsorbs and holds the semiconductor chip 110 and a heater (not shown in FIG. 1) that heats the attachment. Further, the attachment is selected according to the type of the semiconductor chip 110. The specific configuration of the bonding head 14 will be described later.

Further, the bonding head 14 is also provided with a first camera 26. The first camera 26 is attached to the bonding head 14 in a posture in which an optical axis thereof extends downward and captures an image of the substrate 100 or the like loaded on the stage 16. The controller 18 calculates a relative positional relationship between the bonding head 14 and the substrate 100 on the basis of the image captured by the first camera 26 or the like and positions the bonding head 14 on the basis of the calculation result. The stage 16 vacuum-adsorbs and supports the substrate 100 conveyed by a conveying mechanism (not shown). A heater (not shown) is built in the stage 16, and the stage 16 can heat the loaded substrate 100.

The controller 18 controls driving of each part of the manufacturing device 10 and includes, for example, a processor that executes various operations and a memory that stores various programs and data. The controller 18 drives the pickup unit 12 and the bonding head 14 to bond a plurality of semiconductor chips 110 onto the substrate 100. At the time of this bonding, the controller 18 controls temperatures of the heaters provided in the bonding head 14 and the stage 16 to appropriately heat the semiconductor chip 110, which will be described later.

Figure 2:
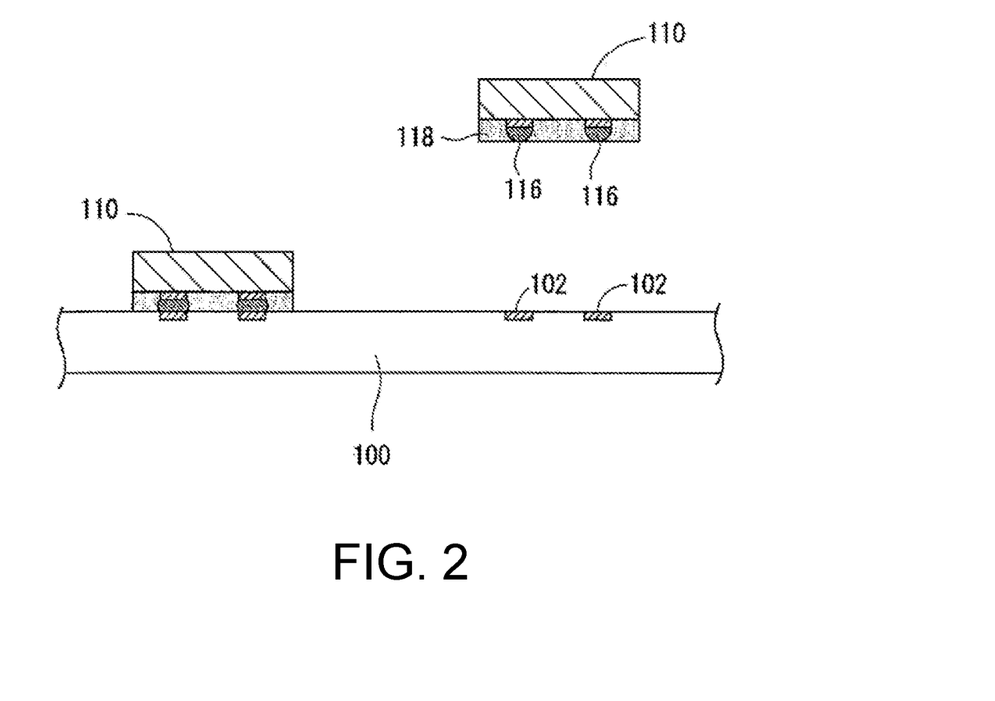
FIG. 2 is a schematic view of a semiconductor chip and a substrate.

Next, the semiconductor chip 110 handled by the manufacturing device 10 will be briefly described. FIG. 2 is a schematic view of the semiconductor chip 110 and the substrate 100. A metal protrusion called a bump 116 is formed on the bottom surface of the semiconductor chip 110. The bump 116 is made of a conductive metal and melts at a predetermined melting temperature. A substrate electrode 102 is formed at a position of the substrate 100 corresponding to the bump 116. When a semiconductor device is manufactured, the bump 116 is melted and joined to the substrate electrode 102.

A non-conductive film (hereinafter referred to as an "NCF") 118 is attached to the bottom surface of the semiconductor chip 110 to cover the bump 116. The NCF 118 functions as an adhesive for adhering the semiconductor chip 110 to the substrate 100 or another semiconductor chip 110. The NCF 118 is made of a non-conductive thermosetting resin such as a polyimide resin, an epoxy resin, an acrylic resin, a phenoxy resin, or a polyether sulfone resin. A thickness of the NCF 118 is larger than an average height of the bumps 116, and the bumps 116 are almost completely covered by the NCF 118. The NCF 118 is a solid film at room temperature, but when it exceeds a predetermined softening start temperature, it gradually and reversibly softens to exhibit fluidity, and when it exceeds a predetermined curing start temperature, it begins to irreversibly cure. The softening start temperature is lower than the curing start temperature of the NCF 118 and the melting temperature of the bump 116.

When the semiconductor chip 110 is bonded to the substrate 100, a temporary pressure bonding step and a main pressure bonding step are executed. In the temporary pressure bonding step, the semiconductor chip 110 loaded on the substrate 100 is pressurized while being heated at a temporary pressure bonding temperature. The temporary pressure bonding temperature is higher than the softening start temperature of the NCF 118 and lower than the melting temperature of the bump 116 and the curing start temperature of the NCF 118. When the semiconductor chip 110 is heated to the temporary pressure bonding temperature, the NCF 118 softens and has fluidity. As a result, the NCF 118 flows into a gap between the semiconductor chip 110 and the substrate 100, and the gap can be reliably filled.

In the main pressure bonding step, the temporarily pressure-bonded semiconductor chip 110 is pressurized while being heated at a main pressure bonding temperature. The main pressure bonding temperature is higher than the melting temperature of the bump 116 and the curing start temperature of the NCF 118. When the semiconductor chip 110 is heated to the main pressure bonding temperature, the bump 116 can be melted and welded to the opposite substrate electrode 102. Further, by this heating, the NCF 118 is cured while filling the gap between the semiconductor chip 110 and the substrate 100, and thus the semiconductor chip 110 and the substrate 100 are firmly fixed.

In both the temporary pressure bonding step and the main pressure bonding step, it is desirable that the semiconductor chip 110 be uniformly heated. That is, in the temporary pressure bonding step, the semiconductor chip 110 needs to have the temporary pressure bonding temperature at both its center and end portion. Similarly, in the main pressure bonding step, the semiconductor chip 110 needs to have the main pressure bonding temperature at both its center and end portion. However, since the bonding head 14 of the related art is provided with only one heating system, it is difficult to make the temperature distribution of the semiconductor chip 110 uniform.

Figure 8:
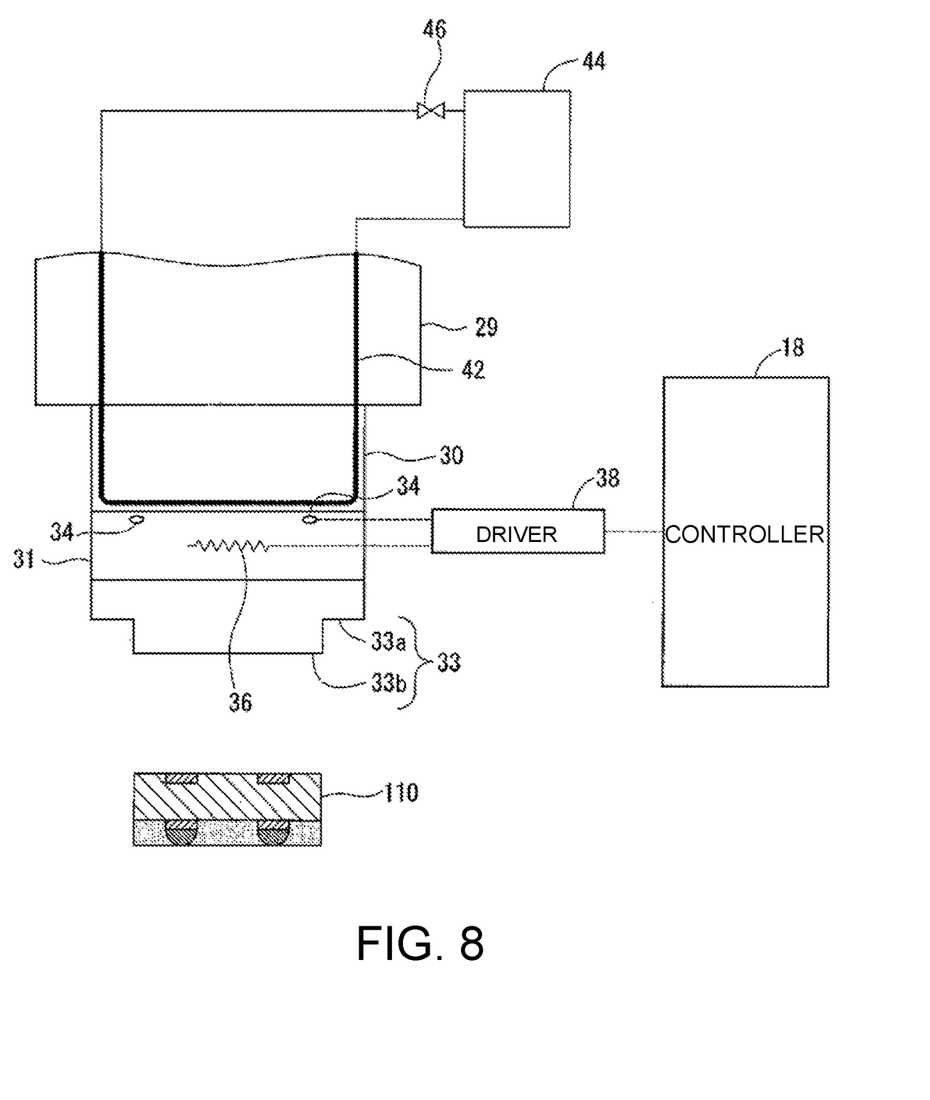
FIG. 8 is a schematic view showing a configuration of a bonding head of the related art.

This will be described with reference to FIG. 8. FIG. 8 is a schematic view showing a configuration of the bonding head 14 of the related art. The bonding head 14 is provided with a base part 29, a heat insulating part 30, a heating part 31, and an attachment 33 side by side in that order from an upper side. The base part 29 is attached to a moving mechanism (not shown) and is made of, for example, stainless steel. The heating part 31 is a portion in which a heat generating resistor 36 is built. The heating part 31 has a flat plate shape and is formed of a ceramic such as aluminum nitride. The heat generating resistor 36 is embedded inside the heating part 31. The heat generating resistor 36 is made of, for example, platinum or tungsten and is electrically connected to a driver 38 having a power supply. When an electric current is applied to the heat generating resistor 36, the heat generating resistor 36 generates heat, and the entire heating part 31 is heated. The heat insulating part 30 prevents the heat of the heating part 31 from being transferred to the base part 29 and is formed of, for example, a ceramic such as Adceram (a registered trademark).

The attachment 33 is attached to a lower side of the heating part 31. The attachment 33 has a rectangular plate-shaped base 33a and an island 33b protruding from a bottom surface of the base 33a. The base 33a has substantially the same outer shape as the heating part 31. The island 33b is smaller than the base 33a and has a quadrangular shape having substantially the same size as the semiconductor chip 110. The attachment 33 is attachable and detachable with respect to the heating part 31 and is appropriately replaced according to the type of semiconductor chip 110 to be handled. Although not shown in FIG. 8, a suction hole that penetrates the attachment 33 in the thickness direction and communicates with a suction pump is formed in the attachment 33. Further, a communication passage for causing the suction hole to communicate with the suction pump is formed in the heating part 31, the heat insulating part 30, and the base part 29. The semiconductor chip 110 is adsorbed and held by the attachment 33 through the suction hole.

Further, a cooling passage 42 through which a refrigerant flows is formed on an upper side of the heating part 31. The cooling passage 42 communicates with a refrigerant supply source 44, and a valve 46 is provided in the middle of the cooling passage 42. The controller 18 controls a flow rate of the refrigerant by controlling an opening amount of the valve 46. When the refrigerant flows through the cooling passage 42, the heating part 31 and the attachment 33 attached to the heating part 31 are cooled.

Here, even in the bonding head 14 of the related art, it is possible to make the temperature distribution of the heating part 31 uniform to some extent by uniformly dispersing the heat generating resistors 36 in the heating part 31. However, a heat absorption rate of the semiconductor chip 110 to be heated increases as it approaches the outside of the semiconductor chip 110. Therefore, in the related art, even if the temperature distribution of the heating part 31 is made uniform, the temperature of the semiconductor chip 110 to be heated tends to decrease as it approaches the outside.

Figure 3:
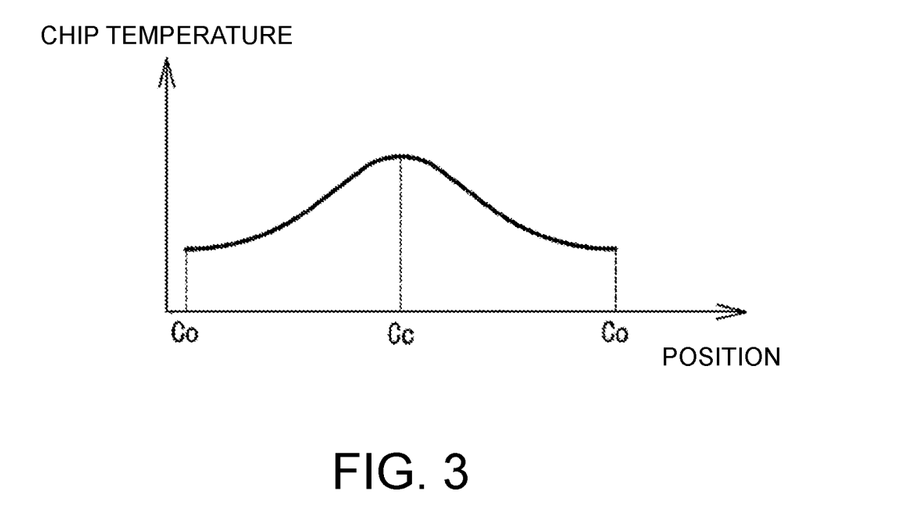
FIG. 3 is a graph showing an example of a temperature distribution of a semiconductor chip.

FIG. 3 is a graph showing an example of temperature distribution of the semiconductor chip 110. In FIG. 3, a horizontal axis represents a position in the semiconductor chip 110, and a vertical axis represents a temperature of the semiconductor chip 110 (hereinafter abbreviated as "chip temperature"). Further, in FIG. 3, "Cc" indicates a center position of the semiconductor chip 110, and "Co" indicates an end portion position of the semiconductor chip 110.

When the semiconductor chip 110 is heated by the bonding head 14 having only one heating system, the chip temperature becomes lower as it approaches the end portion as shown by a solid line in FIG. 3. In other words, in the bonding head 14 of the related art, the temperature distribution of the semiconductor chip 110 tends to vary. In a case in which the temperature distribution of the semiconductor chip 110 is non-uniform in this way, the molten state of the bump 116 and the softened or cured state of the NCF 118 vary depending on a location, which causes problems such as poor bonding of the semiconductor chip 110 and a non-uniform gap amount between the semiconductor chip 110 and the substrate 100 (or another semiconductor chip 110).

Therefore, in the present specification, to make the distribution of the chip temperature uniform, the heating part 31 is divided into a plurality of heating areas in the horizontal direction, and the heating areas are electrically connected to different drivers. This will be described with reference to FIGS. 4 and 5.

Figure 4:
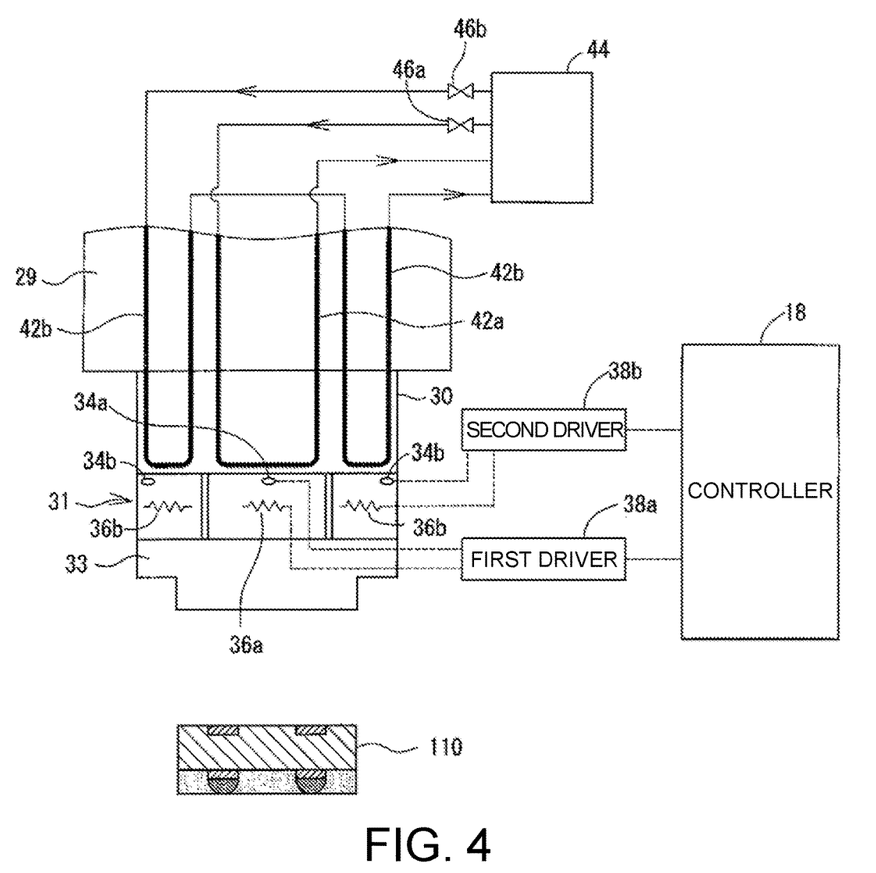
FIG. 4 is a schematic view showing a configuration of a bonding head.
Figure 5:
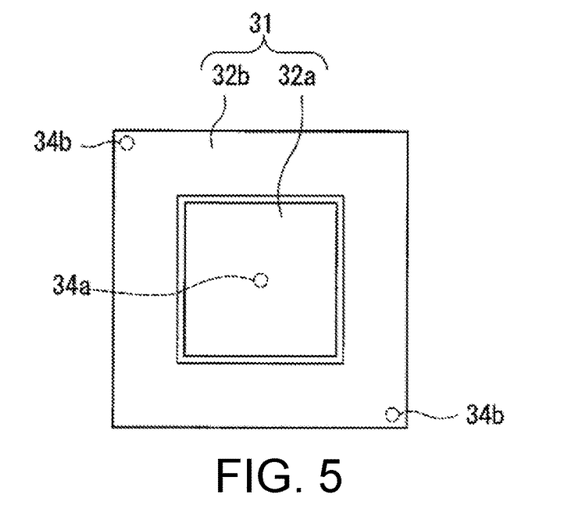
FIG. 5 is a schematic plan view of a heating part of a bonding head.

FIG. 4 is a schematic view showing a configuration of the bonding head 14 installed in the manufacturing device 10. Further, FIG. 5 is a schematic plan view of the heating part 31 of the bonding head 14. In this bonding head 14, a base part 29, a heat insulating part 30, a heating part 31, and an attachment 33 are disposed side by side in that order from an upper side as in the bonding head 14 of the related art. Among these, the configurations of the base part 29, the heat insulating part 30, and the attachment 33 are almost the same as those of the bonding head 14 of the related art.

On the other hand, the heating part 31 of the present example differs from the related art in that it is divided into a first heating area 32a and a second heating area 32b. Specifically, the heating part 31 of the present example is divided into a substantially rectangular first heating area 32a and a quadrangular ring-shaped second heating area 32b that surrounds the outer periphery of the first heating area 32a. A first heat generating resistor 36a is embedded in the first heating area 32a, and a second heat generating resistor 36b is embedded in the second heating area 32b. Further, a first temperature sensor 34a for detecting the temperature of the first heating area 32a is attached to the first heating area 32a, and a second temperature sensor 34b for detecting the temperature of the second heating area 32b is attached to the second heating area 32b.

Here, the temperature sensor 34a or 34b corresponding to one heating area may be provided at a position separated from a boundary with another adjacent heating area. For example, the first temperature sensor 34a may be attached in the vicinity of a center of the first heating area 32a, and the second temperature sensor 34b may be attached in the vicinity of an outer end portion of the second heating area 32b. With such a configuration, the temperature sensor 34a or 34b is less likely to be affected by the temperature of the other adjacent heating area.

The first heat generating resistor 36a and the second heat generating resistor 36b are energized by a first driver 38a and a second driver 38b, respectively. The first driver 38a has a power supply circuit for applying a desired current to the first heat generating resistor 36a. The temperature detected by the first temperature sensor 34a (hereinafter referred to as a "first area detection temperature Ta1") and a first area target temperature Ta1* stored in the controller 18 are input to the first driver 38a. The first driver 38a controls a current value to be applied to the first heat generating resistor 36a according to a difference between the first area detection temperature Ta1 and the first area target temperature Ta1*.

The second driver 38b has a power supply circuit for applying a desired current to the second heat generating resistor 36b. The temperature detected by the second temperature sensor 34b (hereinafter referred to as a "second area detection temperature Ta2") and a second area target temperature Ta2* stored in the controller 18 are input to the second driver 38b. The second driver 38b controls a current value to be applied to the second heat generating resistor 36b according to a difference between the second area detection temperature Ta2 and the second area target temperature Ta2*.

In addition, in FIGS. 4 and 5, a gap is shown between the two heating areas 32a and 32b to clarify the boundary between the two heating areas 32a and 32b. However, in reality, there may be no gap between the two heating areas 32a and 32b. Further, it is not necessary to mechanically separate the first heating area 32a and the second heating area 32b from each other, and the first heating area 32a in which the first heat generating resistor 36a is embedded and the second heating area 32b in which the second heat generating resistor 36b is embedded may be seamlessly connected to each other. That is, the heating part 31 may be formed of a single ceramic. By forming the heating part 31 with a single ceramic in this way, it becomes easy to ensure flatness or the like of the heating part 31, and the semiconductor chip 110 can be pressurized more uniformly.

Further, in the present example, not only a plurality of heating systems but also a plurality of cooling systems is provided. That is, a first cooling passage 42a and a second cooling passage 42b are provided on the upper side of the heating part 31 to correspond to the first heating area 32a and the second heating area 32b. Each of the cooling passages 42a and 42b communicates with a refrigerant supply source 44, and it is possible to change a flow rate of a refrigerant flowing through each of the cooling passages 42a and 42b by controlling an opening/closing amount of each of valves 46a and 46b provided in the middle of the cooling passages 42a and 42b. The opening/closing amount of each of the valves 46a and 46b is controlled by the controller 18. In other words, the controller 18 can control the flow of the refrigerant in each of the two cooling passages 42a and 42b independently of each other. The refrigerant flows through each of the cooling passages 42a and 42b, and thus the corresponding heating areas 32a and 32b are cooled.

Here, as is clear from the above description, in the present example, a heating temperature of the first heating area 32a and a heating temperature of the second heating area 32b can be controlled independently. When the semiconductor chip 110 is bonded, the controller 18 controls the temperatures of the two heating areas 32a and 32b such that the temperature distribution of the semiconductor chip 110 becomes uniform. Specifically, the controller 18 inputs the area target temperatures Ta1* and Ta2* that can make the temperature distribution of the semiconductor chip 110 uniform to the first and second drivers 38a and 38b. More specifically, the controller 18 inputs a value higher than the area target temperature Ta1* of the first heating area 32a located inside to the second driver 38b as the area target temperature Ta2* of the second heating area 32b located outside.

Figure 6:
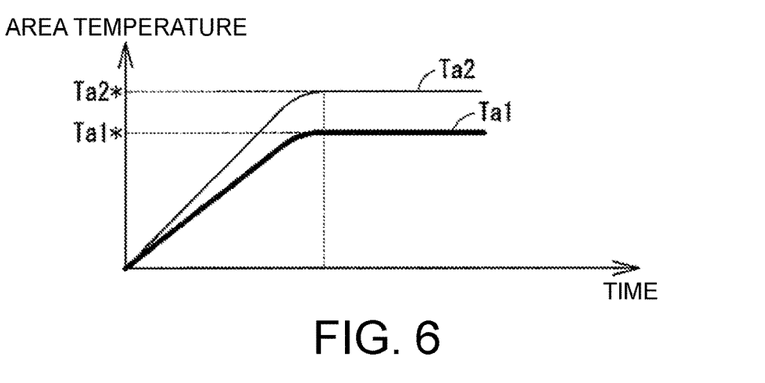
FIG. 6 is a graph showing a change over time in an area detection temperature when a semiconductor chip is bonded.

FIG. 6 is a graph showing a change over time in the area detection temperatures Ta1 and Ta2 when the semiconductor chip 110 is bonded. In FIG. 6, a horizontal axis represents time and a vertical axis represents an area detection temperature. Further, in FIG. 6, a thick line indicates the first area detection temperature Ta1, and a thin line indicates the second area detection temperature Ta2. As shown in FIG. 6, in the present example, the drive of the two heat generating resistors 36a and 36b is controlled such that the first area detection temperature Ta1 becomes the first area target temperature Ta1* and the second area detection temperature Ta2 becomes the second area target temperature Ta2* which is higher than the first area target temperature Ta1*.

It may be difficult to perform delicate temperature control with only energization control of the heat generating resistors 36a and 36b. In that case, the refrigerant may be supplied to the cooling passages 42a and 42b in parallel with the energization of the heat generating resistors 36a and 36b. For example, in a case in which a temperature rise rate of the second area detection temperature Ta2 is higher than the target, the controller 18 may increase an opening degree of the valve 46b provided in the second cooling passage 42b and may temporarily increase the refrigerant flow rate flowing through the second cooling passage 42b. By performing the energization control of the heat generating resistors 36a and 36b and the control of the refrigerant flow rate in parallel in this way, it is possible to heat the heating areas 32a and 32b more accurately.

In any case, since the second heating area 32b located outside has a higher temperature than the first heating area 32a located inside, it is possible to also raise the temperature in the vicinity of the end portion of the semiconductor chip 110 having a high heat absorption rate as in the vicinity of the center. As a result, according to the present example, the temperature distribution of the semiconductor chip 110 can be made uniform.

The controller 18 stores the first area target temperature Ta1* and the second area target temperature Ta2* in advance in the memory to uniformly heat the semiconductor chip 110. The area target temperatures Ta1* and Ta2* are prepared for each step. That is, the controller 18 stores the area target temperatures Ta1* and Ta2* to be used in the temporary pressure bonding step and the area target temperatures Ta1* and Ta2* to be used in the main pressure bonding step.

Further, since the distribution of the heat absorption rate of the semiconductor chip 110 varies depending on the type of the semiconductor chip 110, the area target temperatures Ta1* and Ta2* at which the semiconductor chip 110 can be uniformly heated vary depending on the type of the semiconductor chip 110. Therefore, the area target temperatures Ta1* and Ta2* are also prepared for each type of the semiconductor chip 110 to be handled.

Figure 7:
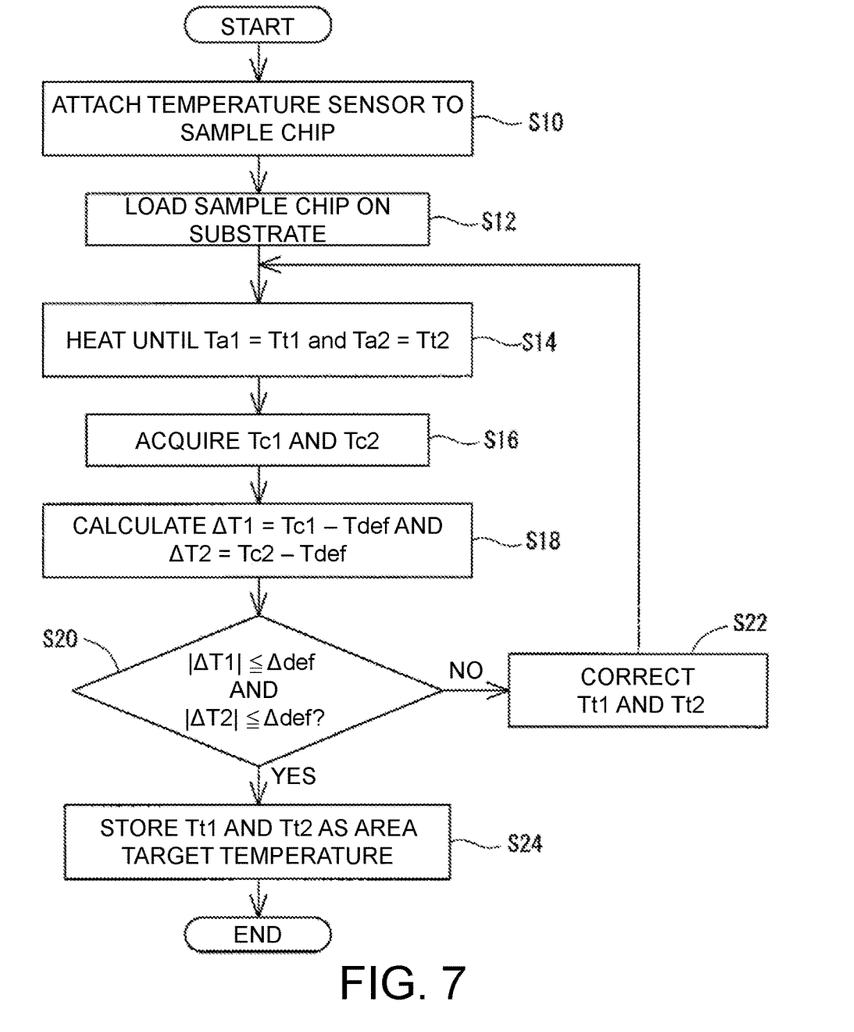
FIG. 7 is a flowchart showing a flow of a target acquisition process.

To acquire such area target temperatures Ta1* and Ta2*, the controller 18 may execute a target acquisition process for acquiring the area target temperature prior to manufacturing the semiconductor device. FIG. 7 is a flowchart showing a flow of the target acquisition process.

In the target acquisition process, first, an inside temperature sensor and an outside temperature sensor are attached to a sample chip (S10). Here, the sample chip is a semiconductor chip 110 of the same type as the semiconductor chip 110 used in the manufacture of an actual semiconductor device. The inside temperature sensor is attached in the vicinity of a center of the sample chip, and the outside temperature sensor is attached in the vicinity of an end portion of the sample chip. Hereinafter, the temperature detected by the inside temperature sensor is referred to as a "first chip detection temperature Tc1," and the temperature detected by the outside temperature sensor is referred to as a "second chip detection temperature Tc2."

The controller 18 drives the bonding head 14 to load the sample chip on the substrate 100 (S12). When the sample chip is loaded on the substrate 100, the controller 18 subsequently heats the heat generating resistors 36a and 36b until the first area detection temperature Ta1 reaches a first temporary target temperature Tt1 and the second area detection temperature Ta2 reaches a predetermined second temporary target temperature Tt2 (S14). Here, the first temporary target temperature Tt1 and the second temporary target temperature Tt2 may have the same value or may be different from each other.

When Ta1=Tt1 and Ta2=Tt2, the controller 18 acquires the first chip detection temperature Tc1 and the second chip detection temperature Tc2 at that time (S16). The controller 18 calculates a difference between the acquired first chip detection temperature Tc1 and a target temperature Tdef of the semiconductor chip 110 as a first difference value ΔT1 and a difference between the acquired second chip detection temperature Tc2 and a target temperature Tdef of the semiconductor chip 110 as a second difference value ΔT2 (S18). Here, in a case in which the area target temperatures Ta1* and Ta2* to be used in the temporary pressure bonding step are acquired, the target temperature Tdef is the temporary pressure bonding temperature. Further, in a case in which the area target temperatures Ta1* and Ta2* to be used in the main pressure bonding step are acquired, the target temperature Tdef is the main pressure bonding temperature.

Subsequently, the controller 18 compares an absolute value |ΔT1| of the first difference value and an absolute value |ΔT2| of the second difference value with an allowable error Δdef (S20). As a result of the comparison, in a case in which |ΔT1| is equal to or less than the allowable error Δdef and |ΔT2| is equal to or less than the allowable error Δdef (in a case of Yes in S20), current temporary target temperatures Tt1 and Tt2 can be determined to be appropriate. Therefore, in this case, the controller 18 stores the current first temporary target temperature Tt1 as the first area target temperature Ta1* and the second temporary target temperature Tt2 as the second area target temperature Ta2* in the memory (S24).

On the other hand, as a result of the comparison, in a case in which |ΔT1| exceeds the allowable error Δdef or |ΔT2| exceeds the allowable error Δdef (in a case of No in S20), the controller 18 corrects the temporary target temperatures Tt1 and Tt2 (S22). A method for correcting the temporary target temperatures Tt1 and Tt2 is not particularly limited as long as it can reduce the difference values ΔT1 and ΔT2. Therefore, for example, values obtained by subtracting values obtained by multiplying the difference values ΔT1 and ΔT2 by predetermined coefficients K1 and K2 from the current temporary target temperatures Tt1 and Tt2 may be calculated as the corrected temporary target temperatures Tt1 and Tt2. That is, Tt1=Tt1−ΔT1·K1 and Tt2=Tt2−ΔT2·K2 may be set.

When the temporary target temperatures Tt1 and Tt2 can be calculated, the controller 18 repeats the processes of steps S14 to S22 again. Finally, when |ΔT1|≤Δdef, |ΔT2|≤Δdef, and step S24 is executed, the area target temperature acquisition process is completed.

The configuration described so far is an example. As long as the heating part 31 is divided into a first heating area and a second heating area that surrounds the first heating area in the horizontal direction and the temperature of the first heating area and the temperature of the second heating area can be controlled independently, other constituent elements may be changed. For example, in the above description, the heating part 31 is divided into a first heating area 32a and a second heating area 32b surrounding the first heating area 32a, but the heating part 31 may be divided into a larger number of areas. For example, the heating part 31 may be divided into a substantially rectangular first heating area, a quadrangular ring-shaped second heating area surrounding the first heating area, and a quadrangular ring-shaped third heating area surrounding the second heating area. Further, in the above description, the temperatures of the two heating areas are controlled independently such that the temperature distribution of the object to be heated becomes uniform. However, the temperature distribution of the object to be heated may be appropriately changed depending on the type of the bonding and the type of the object to be heated. For example, the controller may control the temperatures of the first and second heating areas such that the peripheral edge portion of the object to be heated has a higher temperature than the central portion.

The invention claimed is:

1. A semiconductor device manufacturing device comprising:
   a stage on which a substrate is loaded;
   a bonding head that is disposed facing the stage and bonds a semiconductor chip to the substrate; and
   a controller,
   wherein the bonding head includes
   an attachment that holds the semiconductor chip by suctioning;
   a heating part that detachably holds the attachment and heats the attachment, the heating part having a first heating area and a second heating area that surrounds the first heating area in a horizontal direction; and
   a temperature sensor that detects a temperature of the first heating area and a temperature sensor that detects a temperature of the second heating area,
   wherein the controller stores an area target temperature of the first heating area and an area target temperature of the second heating area in advance and independently controls a heat generating amount of the first heating area and a heat generating amount of the second heating area according to a difference between the area target temperature stored and an area detection temperature of the temperature sensor,
   wherein the controller is configured to execute a target acquisition process for acquiring the area target temperature prior to bonding the semiconductor chip, and
   wherein, in the target acquisition process, the controller causes the bonding head to bond a sample chip, acquires a temperature distribution of the sample chip and an area detection temperature of the first heating area and an area detection temperature of the second heating area at that time, and calculates the area target temperature of the first heating area and the area target temperature of the second heating area based on chip temperature distribution and the area detection temperatures obtained.

2. The semiconductor device manufacturing device according to claim 1,
   wherein the bonding head further has cooling paths which are provided to correspond to the first heating area and the second heating area and are independent of each other, the cooling paths cooling the first heating area and the second heating area corresponding to flow of a refrigerant, and
   wherein the controller controls the heat generating amount and a flow rate of the refrigerant according to the difference between the area target temperature stored and the area detection temperature of the temperature sensor.

3. The semiconductor device manufacturing device according to claim 1,
   wherein the controller controls the heat generating amount of the first heating area and the heat generating amount of the second heating area such that an in-plane temperature distribution of the semiconductor chip becomes uniform during bonding execution.

4. The semiconductor device manufacturing device according to claim 1,
   wherein the area target temperature of the first heating area is lower than the area target temperature of the second heating area.

5. The semiconductor device manufacturing device according to claim 2,
   wherein the controller controls the heat generating amount of the first heating area and the heat generating amount of the second heating area such that an in-plane temperature distribution of the semiconductor chip becomes uniform during bonding execution.

6. The semiconductor device manufacturing device according to claim 2,
   wherein the area target temperature of the first heating area is lower than the area target temperature of the second heating area.

7. The semiconductor device manufacturing device according to claim 3,
   wherein the area target temperature of the first heating area is lower than the area target temperature of the second heating area.

* * * * *